(12) United States Patent
Green et al.

(10) Patent No.: US 7,855,623 B2
(45) Date of Patent: Dec. 21, 2010

(54) LOW LOSS RF TRANSMISSION LINES HAVING A REFERENCE CONDUCTOR WITH A RECESS PORTION OPPOSITE A SIGNAL CONDUCTOR

(75) Inventors: Ronald Green, San Jose, CA (US); Belgacem Haba, Saratoga, CA (US); David William Wallis, Atlanta, GA (US); Nicholas J. Colella, Pleasanton, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 11/821,540

(22) Filed: Jun. 22, 2007

(65) Prior Publication Data
US 2008/0315977 A1    Dec. 25, 2008

(51) Int. Cl.
*H01P 3/08* (2006.01)
(52) U.S. Cl. .................. 333/238; 333/128; 333/161; 333/204
(58) Field of Classification Search ............ 333/1, 333/238, 246, 128, 161, 204
See application file for complete search history.

(56) References Cited

U.S. PATENT DOCUMENTS

| | | | | |
|---|---|---|---|---|
| 4,187,480 A | * | 2/1980 | Frazita | 333/161 |
| 4,281,302 A | * | 7/1981 | Stegens | 333/204 |
| 4,394,633 A | * | 7/1983 | Klein | 333/238 |
| 5,406,233 A | * | 4/1995 | Shih et al. | 333/161 |
| 5,652,557 A | * | 7/1997 | Ishikawa | 333/243 |
| 5,724,012 A | * | 3/1998 | Teunisse | 333/238 |
| 5,868,968 A | | 2/1999 | Takuma et al. | |
| 2003/0214802 A1 | | 11/2003 | Fjelstad et al. | |

FOREIGN PATENT DOCUMENTS

| JP | 09023107 | * | 1/1997 |
|---|---|---|---|
| JP | 2001077608 | * | 9/1999 |

* cited by examiner

*Primary Examiner*—Benny Lee
(74) *Attorney, Agent, or Firm*—Lerner, David, Littenberg, Krumholz & Mentlik, LLP

(57) ABSTRACT

A transmission structure having high propagation velocity and a low effective dielectric loss. The structure comprises a dielectric, a first reference conductor disposed below the dielectric, a signal conductor disposed above the dielectric, and a second reference conductor disposed over the signal conductor. The second reference conductor has a recess portion facing the signal conductor, the recess portion defining a gap between the second reference conductor and the signal conductor. The gap may be filled with air which has a relative dielectric constant approximately equal to one (1). Because of the physical and dielectric constant characteristics of the gap, the structure concentrates an electric field in the gap resulting in an effective dielectric constant approximately (approaching) one (1) and an effective dielectric loss approximately equal to zero (0). Thus, the structure exhibits a propagation velocity approximately equal to the speed of light.

27 Claims, 11 Drawing Sheets

PHASE SHIFTER

LOW LOSS RF TRANSMISSION LINES HAVING A REFERENCE CONDUCTOR WITH A RECESS PORTION OPPOSITE A SIGNAL CONDUCTOR

BACKGROUND OF THE INVENTION

A stripline circuit is often used as a transmission line structure of a radio-frequency (RF) transmission line. A transmission line can be used for communication between circuits such as between chips, racks, backplanes and other interconnection structures. A conventional stripline circuit comprises a generally flat strip metal signal conductor sandwiched between two parallel ground planes. A substrate supporting structure of insulating material includes a dielectric disposed between the signal conductor and the ground planes. The circuit has a characteristic impedance based on the signal conductor width and substrate height. The circuit has a dielectric loss approximately equal to the relative dielectric constant $e_r$ of the substrate which is typically greater than one (1). Dielectric loss refers to the attenuation of a signal or a loss of energy due to the dissipation of energy in the dielectric. Dielectric loss tangent is the imaginary part of the dielectric constant, and determines the amount of loss of the medium. Similar to the dielectric constant, low loss tangents result in a "fast" substrate while large loss tangents result in a "slow" substrate. The stripline circuit has a propagation velocity Vp which is a parameter that characterizes the speed at which an electrical signal passes. Expressed as a percentage, it is the ratio of a signal's transmission speed compared to the speed of light in vacuum. Thus, the transmission of a signal in a vacuum would have a propagation velocity Vp of about 100. Propagation velocity Vp is proportional to the reciprocal of the square root of the relative dielectric constant $e_r$ of the material through which that signal passes. Thus, a conventional stripline circuit having a substrate with a relative dielectric constant $e_r$ greater than one (1) has a propagation velocity Vp less then the speed of light and an effective dielectric loss proportional to the relative dielectric constant er.

It is desirable for a transmission line structure to have a high propagation velocity Vp and low dielectric loss.

SUMMARY OF THE INVENTION

In one aspect of the present application, a transmission line structure is disclosed comprising a dielectric, a first reference conductor disposed below the dielectric, a signal conductor disposed above the dielectric, and a second reference conductor disposed over the signal conductor. The second reference conductor has a recess portion facing the signal conductor, the recess portion defining a gap between the second reference conductor and the signal conductor. The gap is filled with air which has a relative dielectric constant $e_r$ approximately equal to one (1). In certain embodiments, Because of the physical and dielectric constant characteristics of the gap, the structure concentrates an electric field in the gap resulting in an effective dielectric constant approximately approaching and an effective dielectric loss approximately equal to zero (0). Thus, the structure exhibits a propagation velocity approximately equal to the speed of light.

DETAILED DESCRIPTION OF THE INVENTION

Figure 1:
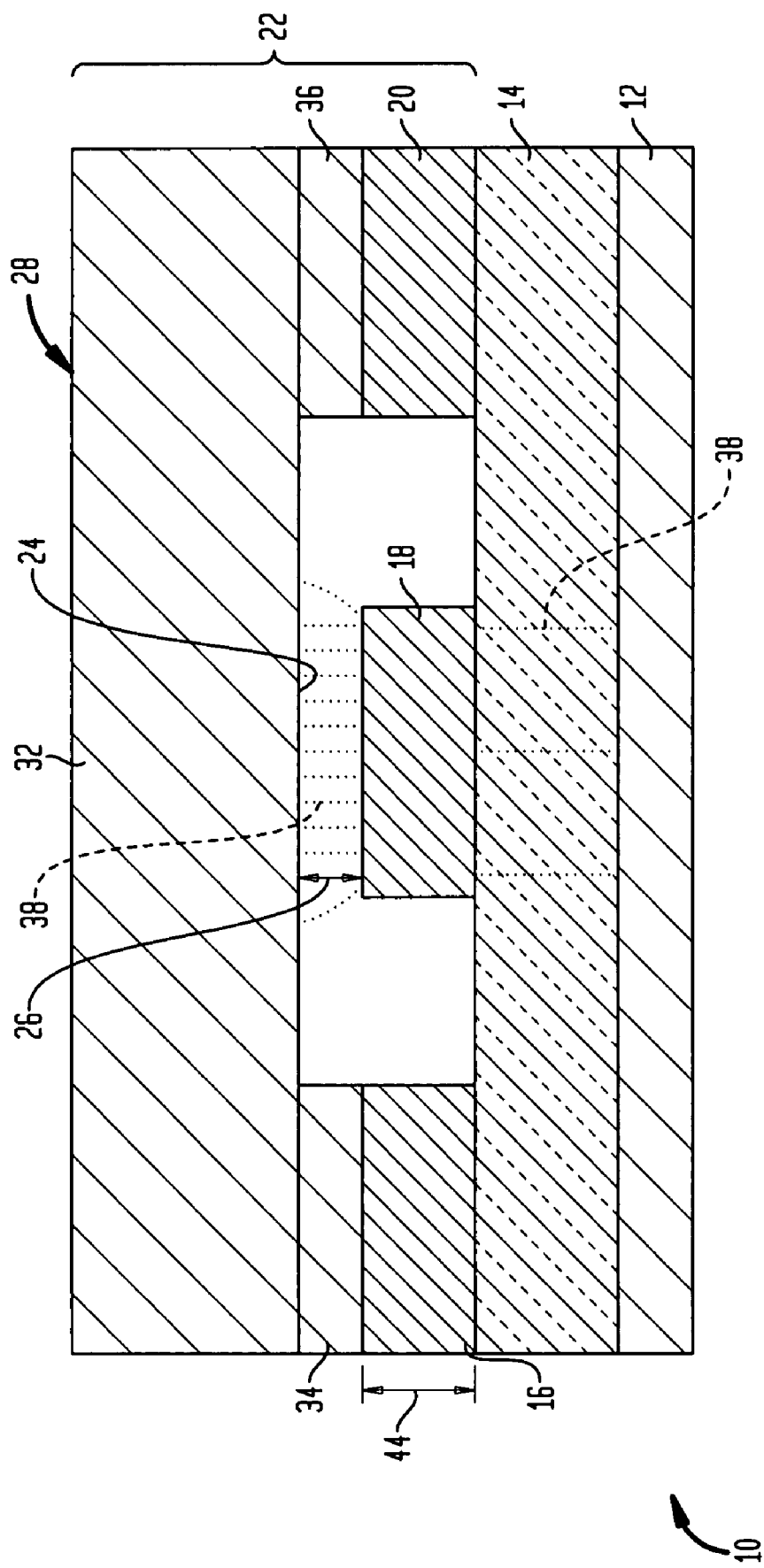
FIG. 1 is a diagrammatic sectional view of a transmission line structure in accordance with an embodiment of the application.
Figure 2:
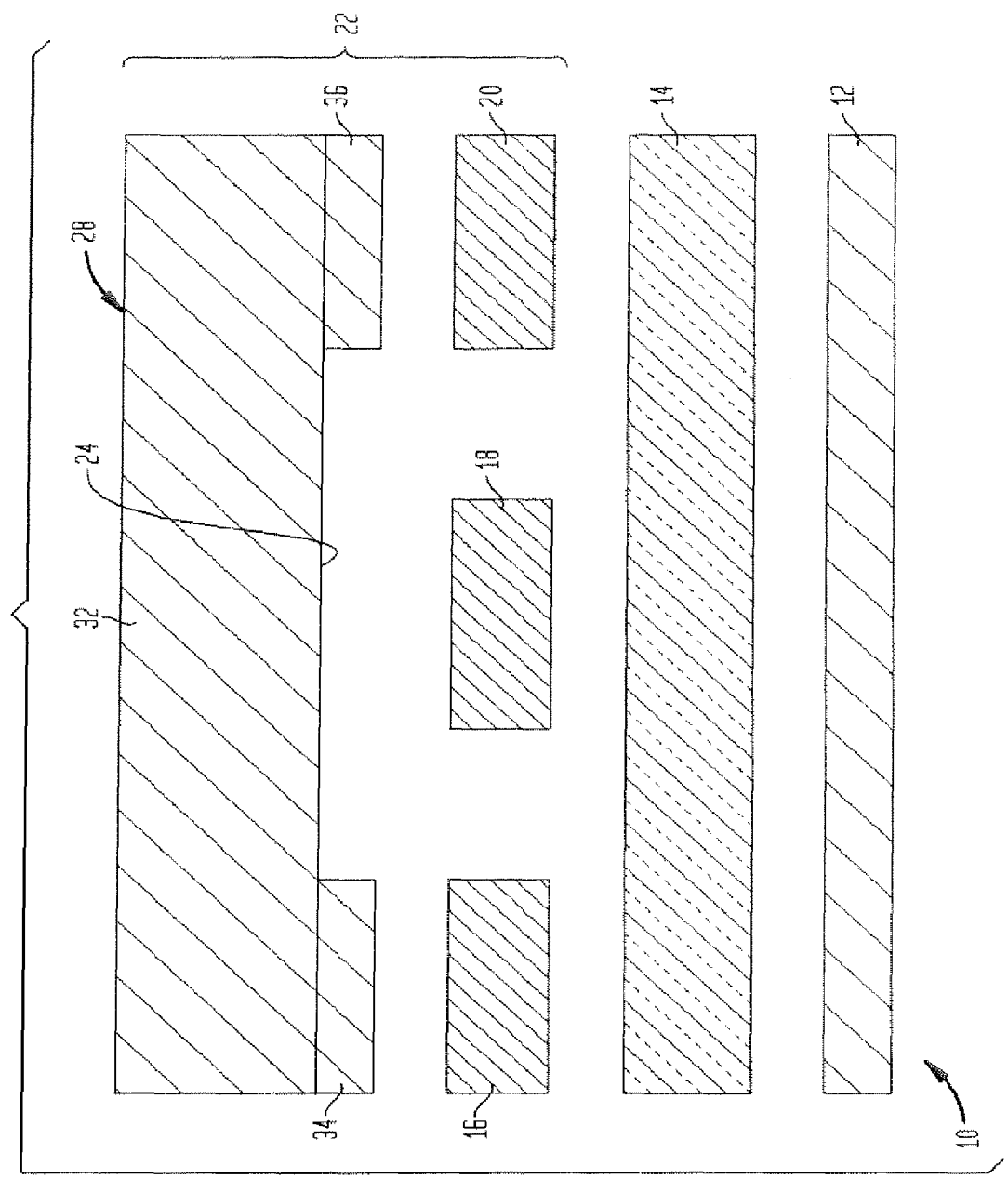
FIG. 2 is an exploded view of the transmission line structure of FIG. 1.

Referring to FIGS. 1 and 2, shown is a transmission line structure 10 having a high propagation velocity and a low effective dielectric loss. The transmission line structure 10 is a stripline comprising a dielectric 14, a first reference conductor 12 disposed below the dielectric, a signal conductor 18 disposed above the dielectric, and a second reference conductor 22 disposed over the signal conductor. The second reference conductor 22 is made of metal or other conductive material and has a recess portion 24 facing the signal conductor 18 such that the recess portion defines a gap 26 (FIG. 1) between the bottom surface of the second reference conductor 22 and the top surface of the signal conductor 18. The second reference conductor 22 also includes a pair of conductive portions 16, 20 extending alongside the signal conductor 18 on the top surface of the dielectric 14. The second reference conductor 22 includes a bridge structure 28 extending between the conductive portions 16, 20 and extending over the signal conductor 18. The bridge structure 28 includes a conductive plane 32 and a pair of ridges 34, 36 overlying the conductive portions 16, 20. The conductive portions 16, 20 and the signal conductor 18 have the same thickness 44 (FIG. 1). The ridges 34, 36 may be formed integrally with the conductive plane 32. The ridges 34, 36 may have a height sufficient to provide the gap 26. The first reference conductor 12 is generally planar or flat and is made of metal or other conductive material. The dielectric 14 is generally planar or flat and has a relative dielectric constant $e_r$ greater than 1 whereas the gap 26 is filled with air or with another gas which has a relative dielectric constant $e_r$ approximately equal to one (1). The conductive plane 32 of the second reference conductor 32 is disposed closed to the signal conductor. Stated another way, the height of the gap 26 desirably is less than the thickness of dielectric 14. As a result, the transmission line structure 10 has an effective dielectric constant $e_r$ approaching one (1) and an effective dielectric loss approximately equal to zero (0). Moreover, the structure 10 has a propagation velocity Vp approximately equal to the speed of light C.

Referring to FIGS. 1 and 2, a description is provided of a method of making the transmission line structure 10. In one embodiment, the transmission line structure 10 can be formed as a printed circuit board (PCB) using etching techniques or other well known PCB manufacturing techniques. The dielectric 14 is formed over the top surface of the first reference conductor 12 or laminated to the first reference conductor. Before or after this step, the signal conductor 18 and the conductive portions 16, 20 are formed over the top surface of the dielectric 14.

The signal conductor 18 and the conductive portions 16 and 20 may be formed from a common layer of metal. For example, using ordinary printed circuit board manufacturing techniques, a layer of metal may be laminated to the top surface of dielectric layer 14. The layer is then masked by a photoresist in areas corresponding to the second conductor 18 and the conductive portions 16 and 20. The other portions of the metal layer are then removed by etching and the photoresist is stripped away. The resultant signal conductor 18 and conductive portions 16 and 20 have exactly the same thickness, and are formed at essentially no cost beyond that incurred in forming the signal conductor 18 above.

Figure 3:
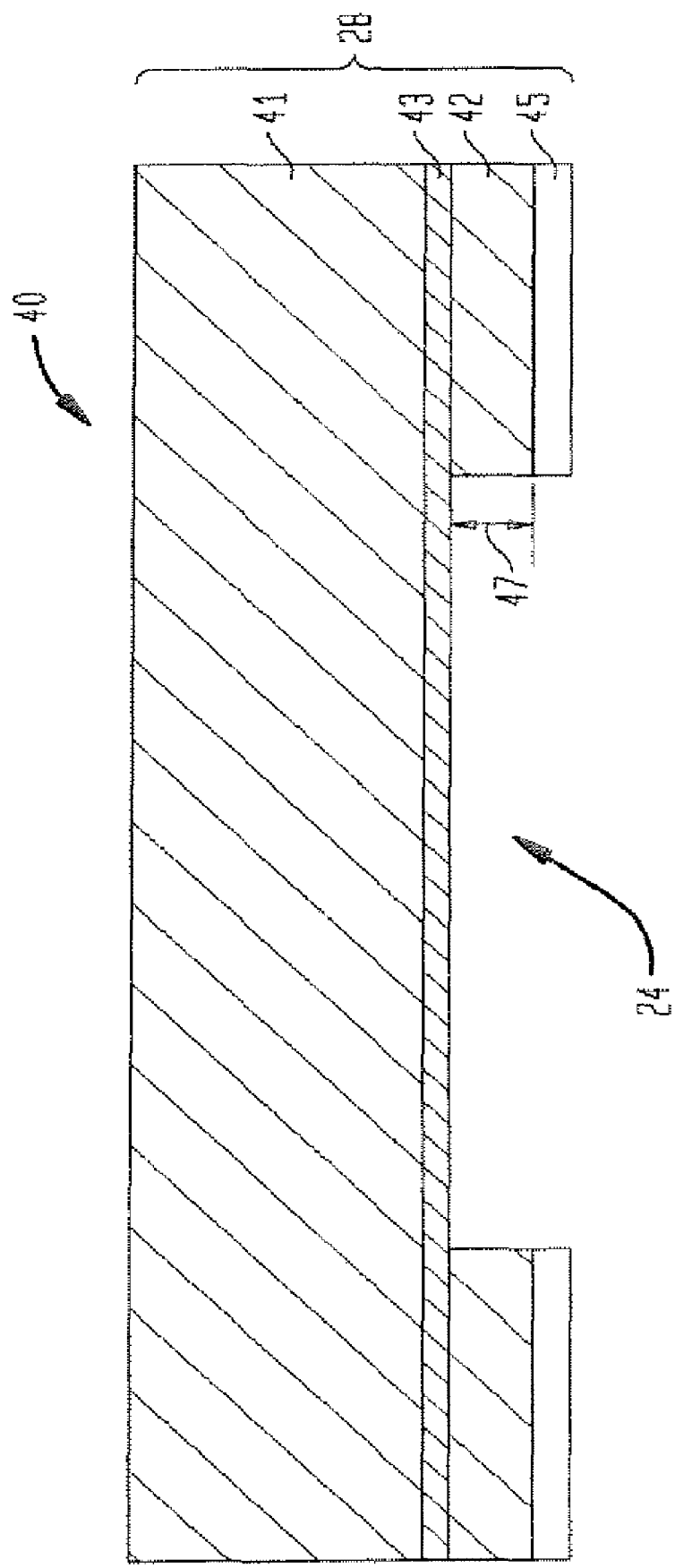
FIG. 3 shows the formation of the second reference conductor of the transmission line structure of FIG. 1.

As best shown in FIG. 3, the bridge structure 28 part of the second reference conductor 22 (FIG. 2) can be formed by removing a portion from the bottom side of a starting structure 40 to form a recess 24. For example, the starting structure 40 may include a first layer 41 of a conductive material such as copper, a thin etch-stop layer 43 of material such as nickel, and a further layer 42 of a conductive material such as copper. The exposed bottom surface of layer 42 is covered with a resist 45 in areas which are to form the ridges, and the exposed surface is treated with an etchant which attacks the metal of layer 42 but which does not substantially attack the metal of etch-stop layer 43. After etching, the resist 45 is removed. The etch-stop layer 43 may be removed in the area between the ridges or may be left in place. The resultant ridges 34 and 36 (FIG. 1) have a height equal to the thickness 47 of layer 42 (FIG. 3) in the starting structure 40. Referring to FIGS. 1 and 2, the second reference conductor 22 is bonded in the structure 10 with the conductive portions 16, 20 contacting respective ridges 34, 36 and with the recess portion 24 facing the signal conductor 18. The bonding technique desirably does not introduce appreciable variation in the height of the structure. For example, techniques such as diffusion or eutectic bonding, thermosonic bonding or the like can be used. A very thin layer of solder may be used. The above technique of forming the recess 24 provides for accurate depth control of the gap 26 (FIG. 1) at low cost. Although the drawings depict only a single stripline, numerous striplines can be formed simultaneously on a single circuit panel.

The following describes a method of using the transmission line structure 10 of FIG. 1. In a typical application, the signal conductor 18 is coupled to an RF signal source (not shown) and the first and second reference conductors 12, 22 are coupled to the same reference potential, for example, ground. The RF signal generates an electric field 38. Most of the electric field 38 is concentrated in the narrow gap 26 above the signal conductor 18. In contrast, only a small portion of the electric field 38 is concentrated below the signal conductor and through the dielectric 14. As explained above, the gap 26 is filled with air or other gas so it has a relative dielectric constant $e_r$ approximately equal to one (1) which is less than that of dielectric 14. As a result, because most of the electric field 38 is concentrated in the gap 26, the structure 10 has an effective dielectric constant $e_r$ approximately equal (approaching) to that of the gap, in this case, about one (1). Moreover, because there is essentially no dielectric loss in the gap because it is gas-filled, the structure 10 achieves an effective dielectric loss of approximately equal to zero (0). Furthermore, because the effective dielectric constant $e_r$ of the structure 10 is close to one (air), the structure achieves a propagation velocity Vp approximately equal to the speed of light C.

Figure 4:
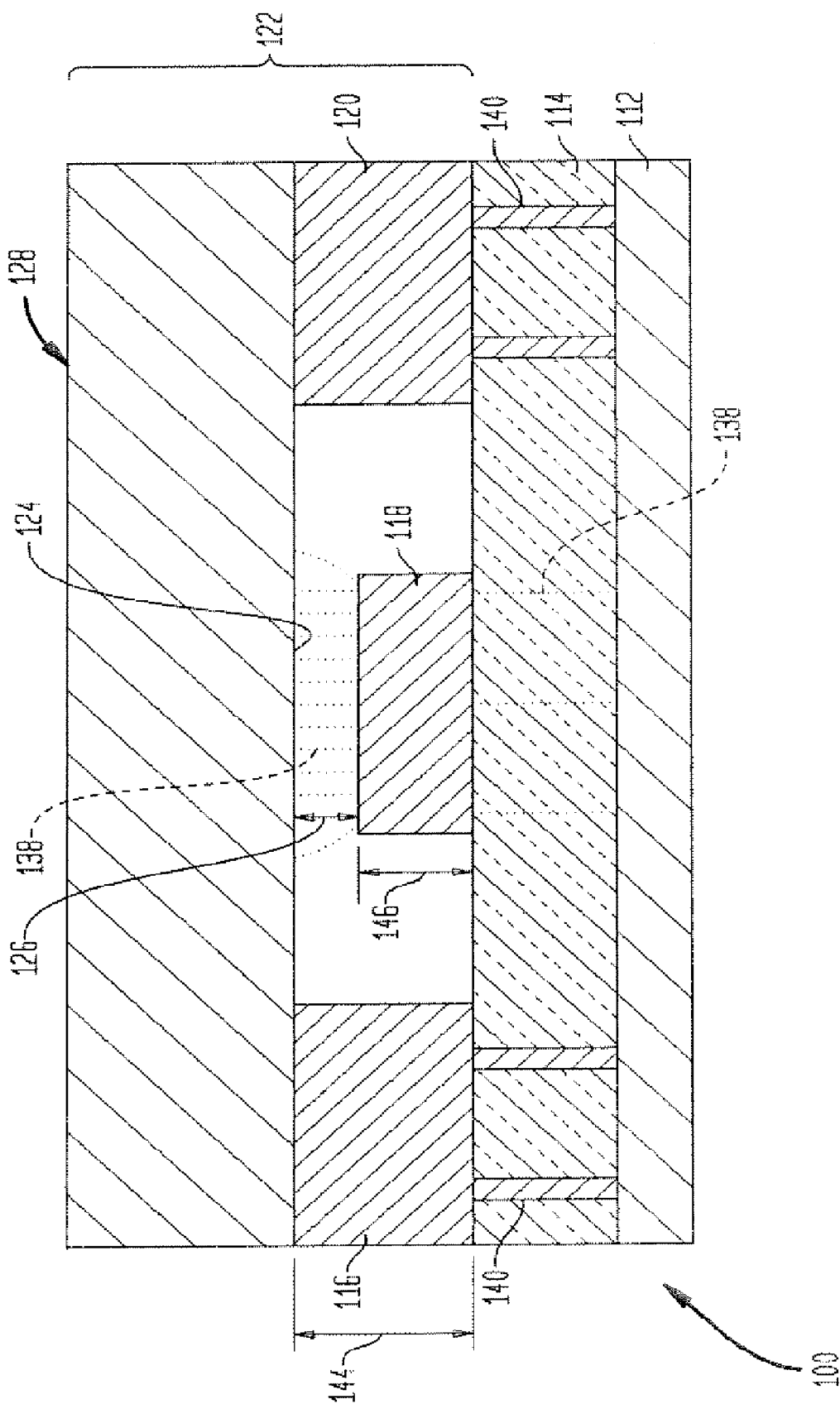
FIG. 4 is a diagrammatic sectional view of a transmission line structure in accordance with another embodiment of the application.
Figure 5:
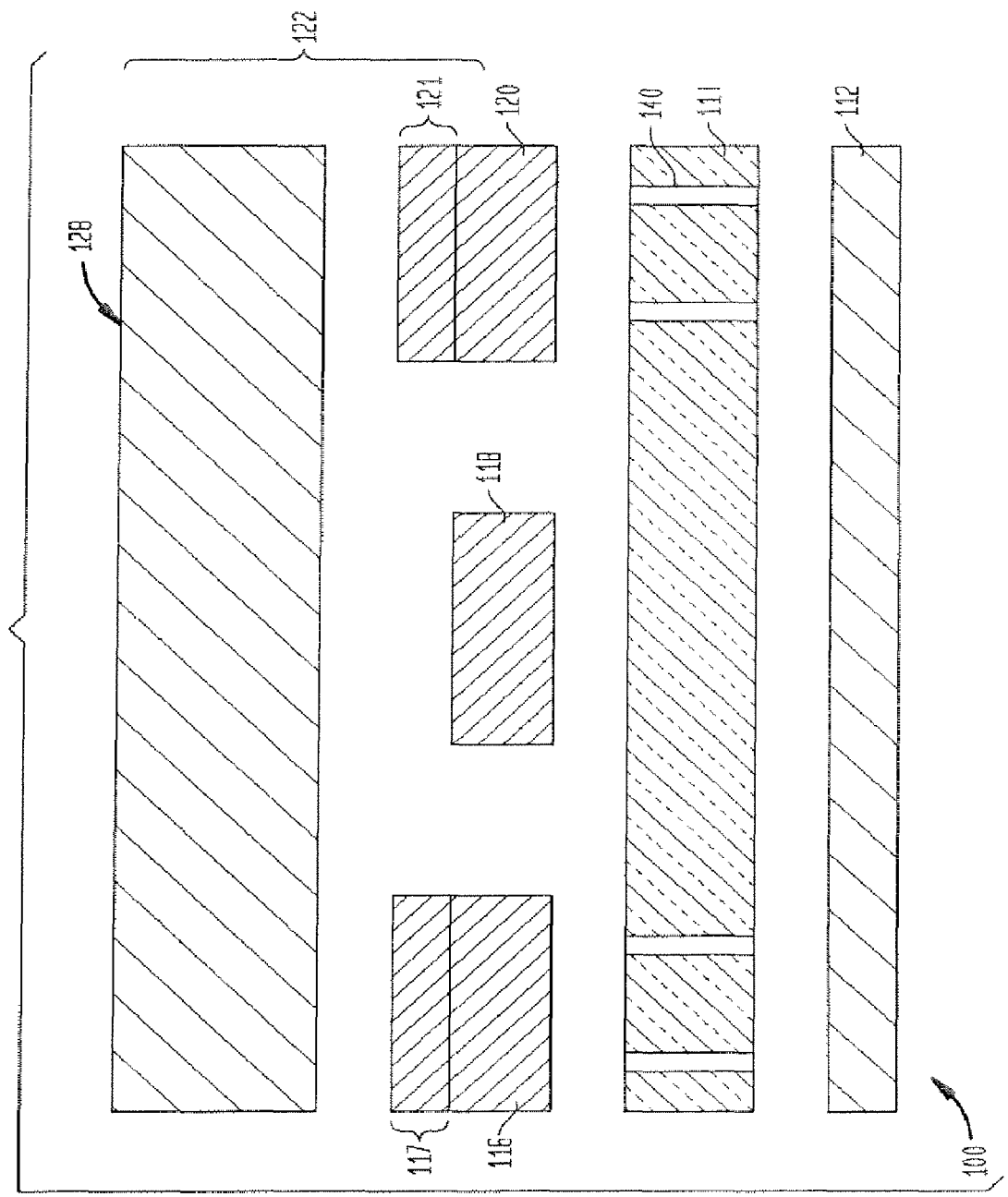
FIG. 5 is an exploded view of the transmission line structure of FIG. 4.

Referring to FIGS. 4 and 5, shown is another embodiment of a transmission line structure 100 having a high propagation velocity and a low effective dielectric loss. Like the transmission line structure 10 of FIG. 1, the transmission line structure 100 comprises a dielectric 114, a first reference conductor 112 disposed below the dielectric 114, a signal conductor 118 disposed above the dielectric, and a second reference conductor 122 disposed over the signal conductor. The second reference conductor 122 includes a pair of conductive portions 116, 120 extending alongside the signal conductor 118 on the top surface of the dielectric 114. The second reference conductor 122 also includes a flat plate 128 formed from copper or other conductive material. Moreover, unlike the conductive portions 16, 18 of structure 10 of FIG. 1, the conductive portions 116, 120 have a thickness larger than that of the signal conductor 118. The second reference conductor 122 extends over the signal conductor 118. Because of the difference in thickness between conductive portions 116, 120 and signal conductor 118, a gap 126 (FIG. 4) is formed as recess 124 (FIG. 4) between the bottom surface of the second reference conductor 122 and the top surface of the signal conductor 118. Unlike the structure 10 in FIG. 1, the structure 100 has vias 140 connected between the top surface of the first reference conductor 112 and bottom surface of the conductive portions 116, 120. The characteristics of the transmission line structure 100 are similar to those of the transmission line structure 10 of FIG. 1 and are not repeated here. For example, the effective dielectric constant Er of the structure 10 is close to 1 (air) which enables the structure to achieve a propagation velocity Vp approximately equal to the speed of light C.

The following describes a method of making the transmission line structure 100 of FIGS. 4 and 5. Like the structure 10 of FIG. 1, the dielectric 114 is united with the top surface of the first reference conductor 112. The signal conductor 118 and the conductive portions 116, 120 are formed over the top surface of the dielectric 114. Vias 140 are formed through the dielectric 114. However, unlike the structure 10 of FIG. 1, in the structure 100, the thickness of the conductive portions 116, 120 (FIG. 4) is larger than that of the signal conductor 118. A selective plating process may be used to add additional layers 117, 121 (FIG. 5) to respective conductive portions 116, 120 to increase the thickness of the conductive portions relative to the signal conductor 118, as shown in FIG. 5. The additional layers 117, 121 have a thickness sufficient to provide the recess 124 and the gap 126. Alternatively, the signal conductor 118 and conductive portions 116, 120 may be formed by selective etching of a metal structure. For example, the metal structure may include an etch-stop layer similar to that discussed above with reference to FIG. 3. The plate 128 (as shown in FIG. 4) is then bonded to conductive portions 116 and 120 with the top surface of the conductive portions 116 and 120 contacting the bottom surface of the plate 128. Because of the difference in the thickness 144 of the conductive portions 116, 120 compared to the thickness 146 of the signal conductor 118, gap 126 is formed between the top surface of the signal conductor 118 and the bottom surface of the second plate 128.

The operation and performance of the transmission line structure 100 of FIG. 4 is similar to that of the transmission line structure 10 above and exhibits some of the same advantages as structure 10. For example, most of an electric field 138 is concentrated in the narrow gap 126 above the signal conductor 118. As a result, the structure 100 has an effective dielectric constant $e_r$ approximately equal to that of the gap, in this case, about one (1). Moreover, because there is no dielectric loss in the gap because it is air compared to that of the dielectric 114, the structure 100 achieves an effective dielectric loss of approximately equal to zero (0). Furthermore, because the effective dielectric constant Er of the structure 100 is close to one (air), the structure achieves a propagation velocity Vp approximately equal to the speed of light C.

Figure 6:
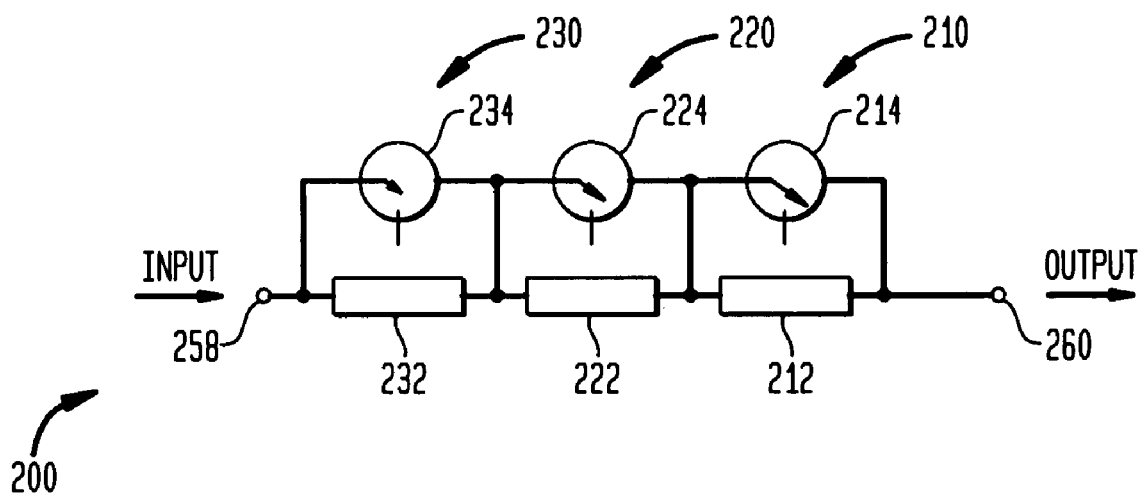
FIG. 6 is a block diagram of an embodiment of a phase shifter in accordance with an embodiment of the application.

FIG. 6 is a block diagram of an embodiment of a phase shifter 200 using the transmission line structure of FIG. 1. The phase shifter 200 can be used as part of a phased array radar. The phase shifter 200 includes an input port 258 to receive an input signal and an output port 260 to provide an output signal. A phased array radar includes a plurality of aerials or antennas (not shown) where the phase of the signal to each individual aerial is controlled in such a manner that the signal is reinforced in a desired direction and canceled in another direction. The phase shifter 200 is a 3-bit discrete step shifter because it includes 3 discrete interconnected phase shift modules 210, 220, 230. The phase shift modules 210, 220, 230 include respective transmission line structures 212, 222, 232 which are controlled by respective ferrite (isolator) high power switches 214, 224, 234. The transmission line structures 212, 222, 232 are configured to provide different propagation velocities which allow a signal transmitted by a particular transmission line structure to have a particular output phase characteristic. In operation, the system turns on a particular switch which enables a corresponding transmission line structure with a particular propagation velocity allowing the selected structure to radiate or transmit a signal through a corresponding aerial (not shown). Because the structures exhibit different propagation velocities, the system can select particular transmission line structures to provide a desired transmission pattern.

Figure 7:
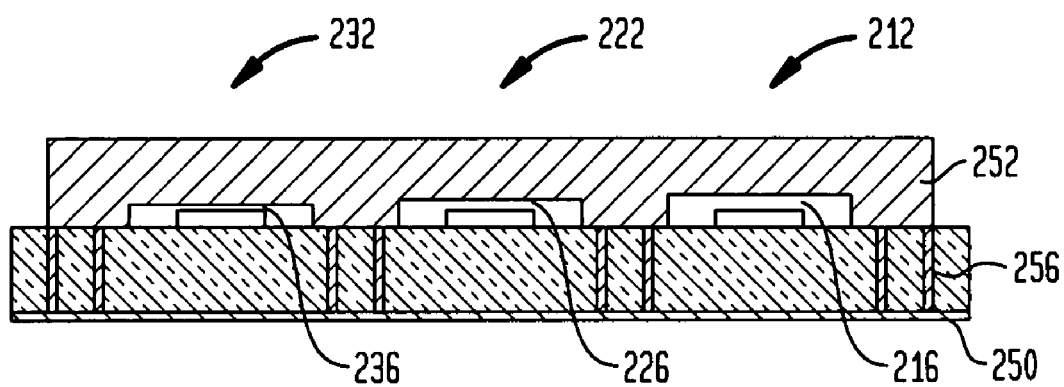
FIG. 7 is a diagrammatic sectional view of a transmission line structure for use with the phase shifter of FIG. 6.

FIG. 7 is a diagrammatic sectional view of an embodiment of the transmission line structures of FIG. 6. The transmission line structures 212, 222, 232 are configured with different size gaps 216, 226, 236 which allow the structures to have different propagation velocities and thus different phase characteristics. Although the transmission line structures 212, 222, 232 have different size gaps 216, 226, 236, the structures share a common first reference conductor 250 and a second reference conductor 252. The structures 212, 222, 232 have vias 256 connected between the first reference conductor 250 and the second reference connector 252. As explained above, the transmission line structures of the present application provide a high propagation velocity and low loss transmission line ideal for phased array applications.

Figure 8:
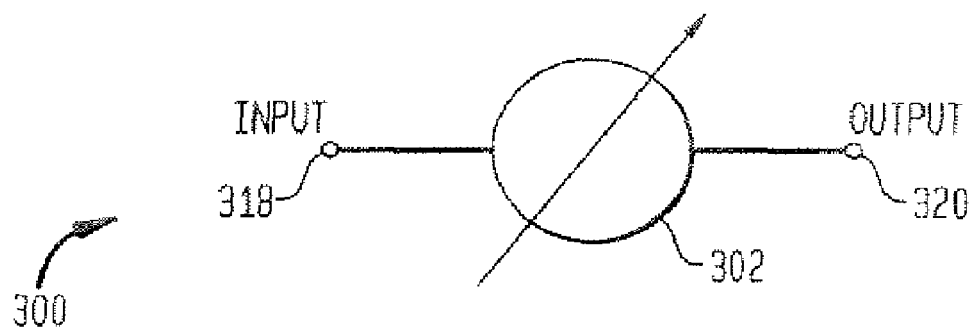
FIG. 8 is a block diagram of a phase shifter according to another embodiment of the application.

FIG. 8 is a block diagram of another embodiment of a phase shifter 300. Unlike the discrete step phase shifter 200 of FIG. 6, the phase shifter 300 is a single variable phase shifter. The phase shifter 300 includes an input port 318 to receive an input signal and an output port 320 to provide an output signal. The variable phase shifter 300 comprises a single module 302 which includes a transmission line structure of the present application. The transmission line structure is configured to have a propagation velocity that can be varied over a predefined range by an input control signal. Thus, varying the propagation velocity causes the phase of an output transmission signal from the phase shifter to vary accordingly. In this manner, the system can vary the phase of the output signal to provide a particular transmission pattern.

Figure 9:
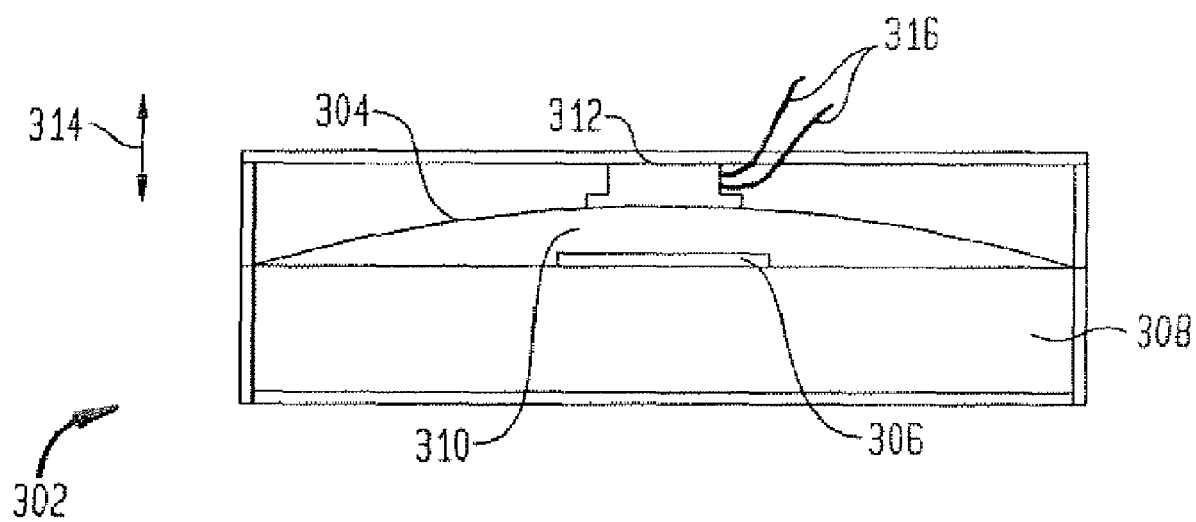
FIG. 9 is a diagrammatic sectional view of a transmission line structure for use with the phase shifter of FIG. 8.

FIG. 9 is a diagrammatic sectional view of an embodiment of the transmission line structure 302 of the phase shifter 300 of FIG. 8. The transmission line structure 302 includes a signal conductor 306 formed over a dielectric 308 to form a gap 310 as in the structure 10 of FIG. 1. However, unlike the structure 10 of FIG. 1, transmission line structure 302 has a second reference conductor 304 made of a flexible material instead of a rigid material as in the transmission line structure 10 of FIG. 1. For example, the second reference conductor 304 is made of a polyimide copper tape with the copper side facing the signal conductor 306. However, unlike the gap 26 of structure 10 which is fixed, the gap 310 of structure 300 is variable or adjustable. An actuator 312 is coupled to the top surface of the second reference conductor 304 to control its vertical (up/down) displacement as shown by arrows 314 and thus the height of the gap 310. The actuator 312 is shown as a stacked piezo crystal and has a control input for receiving a control signal 316 for controlling the operation of the actuator. However, other means of varying the displacement of the second reference conductor are contemplated such as a magnetic field configured to act on a ferrous spreading bar. For relatively high power applications, such as radar, the dielectric 308 can be Teflon (with a relative dielectric constant $e_r$ of about 2.2) which allows for a wider trace and thus a larger gap for increased voltage breakdown.

In operation, an input signal for transmission is coupled to the signal conductor 306 and a control signal, for example a direct current (DC) signal, is coupled to the control input 316 of the actuator 312. As the control signal is varied, the second reference conductor 304 is displaced a proportional amount shown by arrows 314 which causes the height of the gap 310 to vary accordingly. As a result, the effective dielectric constant $e_r$ of the structure is changed which causes the propagation velocity and phase of the transmission signal to change accordingly.

Figure 10:
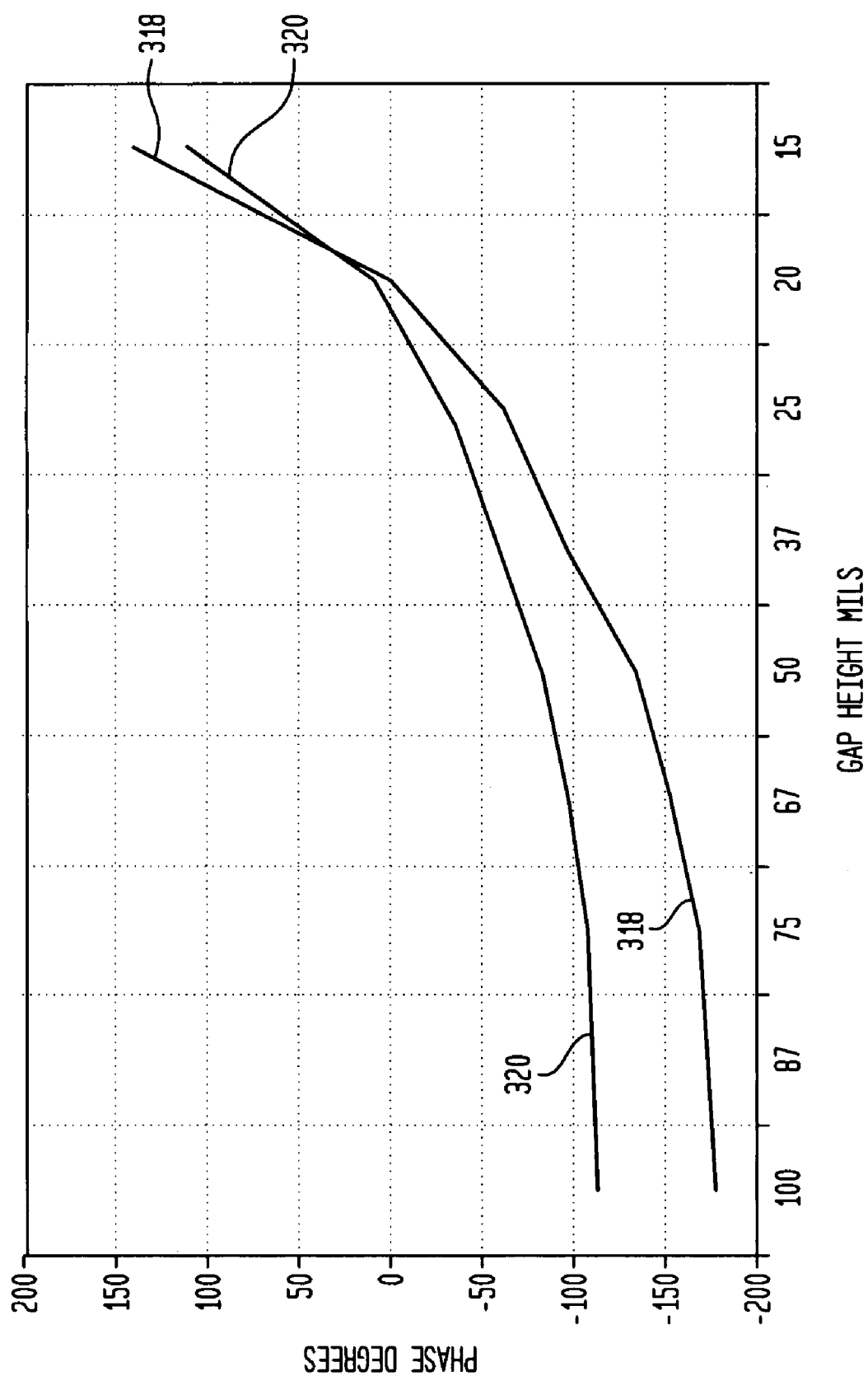
FIG. 10 is a graph showing characteristics of the phase shifter of FIG. 9.

FIG. 10 is a graph showing characteristics of the phase shifter of FIG. 9. The graph shows the amount of phase shift in degrees (on the vertical axis) as a function of the height of the gap in mils (shown on the horizontal axis). The graph illustrates the amount of phase shift for a phase shifter having a length of about 5 inches and a second reference conductor having a gap whose thickness (height) varies over a range of about 10 to 100 mils. In one example, the graph shows that the phase shifter can vary the phase of a 7 GHz signal (shown as reference designator 318) by about 230 degrees. In another example, the graph shows that the phase shifter can vary the phase of a 10 GHz signal (shown as reference designator 320) by about 322 degrees. The phase shifter exhibits an impedance of about 50 ohms, a return loss greater than 20 dB and an insertion loss of less than 1 dB, over the indicated gap height range.

Figure 11:
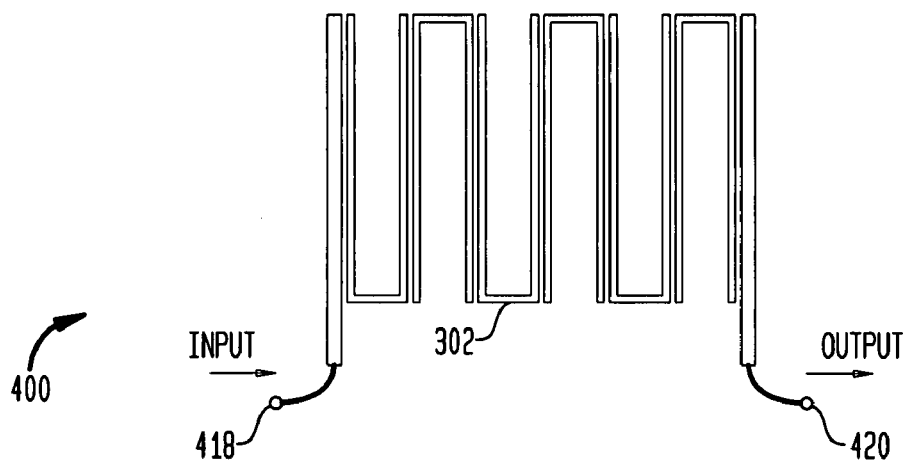
FIG. 11 is a diagram of a microwave filter in accordance with an embodiment of the application.

FIG. 11 is a diagram of a hair-pin microwave filter 400 that can employ the transmission line structure 302 of FIG. 9. The filter 400 is configured as a bandpass filter comprising a plurality of U-shaped sub-circuits consisting of a transmission line with mitered bends on both sides. The filter 400 includes an input port 418 to receive an input signal and an output port 420 to provide an output signal. As explained above, the transmission line structure 302 of FIG. 9 has a second reference conductor which is variable and can be displaced a certain amount which causes the height of the gap to vary accordingly. As a result, the effective dielectric constant of the structure changes which causes the propagation velocity to change accordingly. In turn, the change in propagation velocity causes the resonator electrical length of the filter to change. This change causes the frequency of operation of the filter to change and thus provide a change in the bandpass response of the filter. Thus, the propagation velocity of the transmission line structure of the present application can be configured to be adjustable thereby providing a tunable filter for use in a microwave filter application. Some microwave devices may have a front end section with multiple band filters or a high Q filter. Such a device may also have splitters and switches which may introduce loss in the signal path. The structure 302 of the present application can be configured as a variable (tunable) filter which provides low insertion loss. Thus, the structure 302 is well suited for microwave devices and is capable of improving the overall performance of such microwave devices. In one embodiment, the structure of the present application also can be used with superconducting technology to provide an RF brick wall tunable filter with a high Q.

Figure 12:
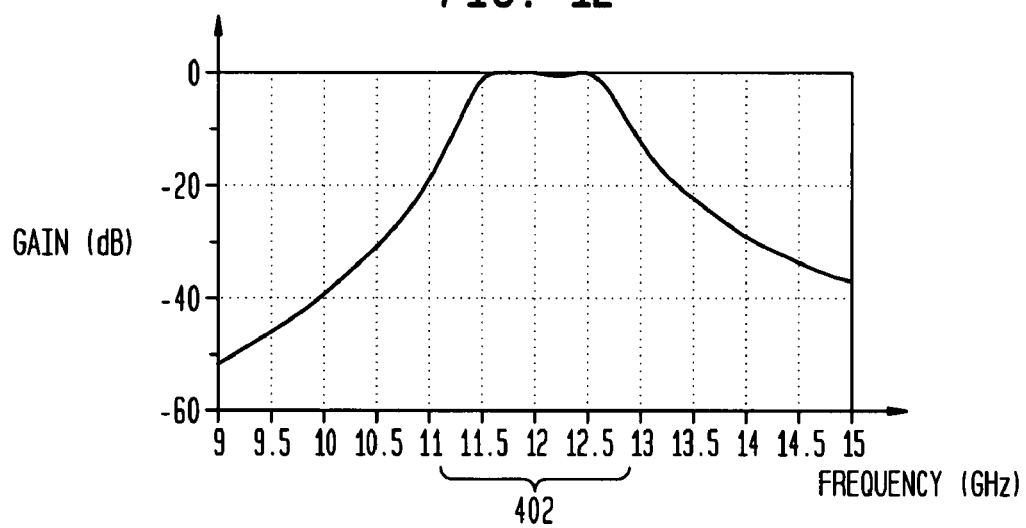
FIGS. 12, 13 and 14 are graphs showing characteristics of the microwave filter of FIG. 11.
Figure 13:
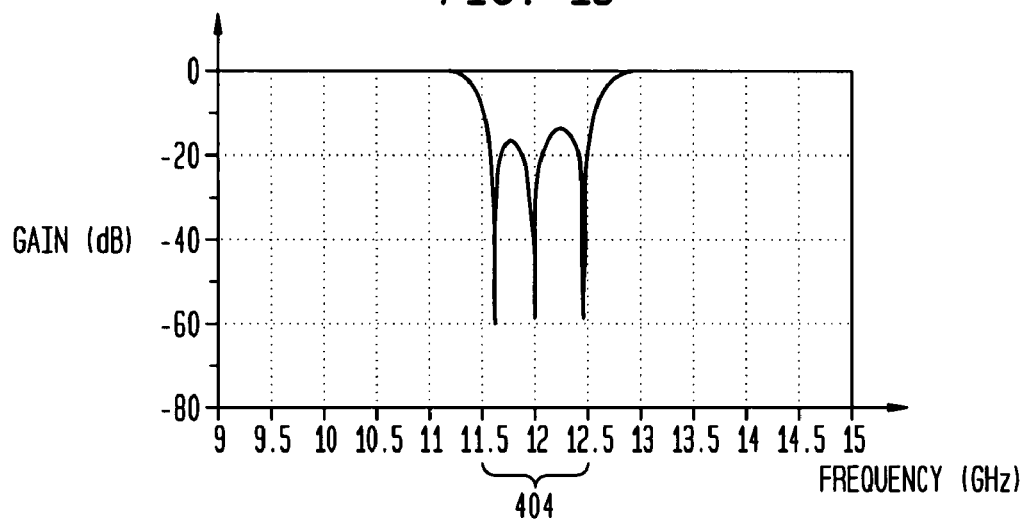
Figure 14:
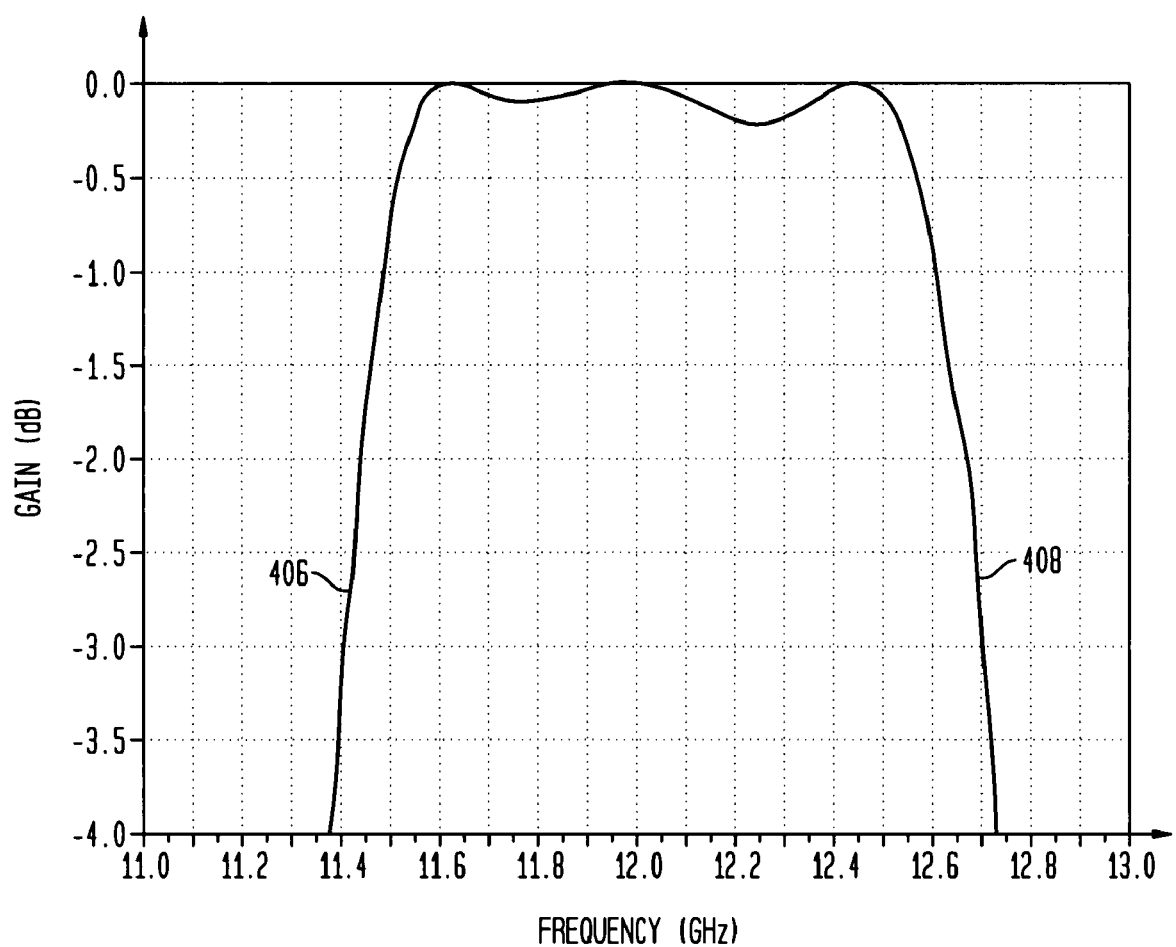

FIGS. 12, 13 and 14 are graphs showing characteristics of the microwave filter of FIG. 11. FIGS. 12, 13 and 14 show the frequency response, in units of gain (dB) for different frequencies within the gigahertz (GHz) range, of the transmission line structure of the present application configured as a tunable microwave filter. The filter provides a bandwidth that can be narrowed and a center frequency that can be tuned over a predefined range. For example, the graph of FIG. 12 shows a filter having an initial bandwidth (shown as reference designator 402) of about 1 GHz. FIG. 13 shows that the transmission line structure of the present application can be adjusted to narrow the filter bandwidth (shown as reference designator 404) to about 0.5 GHz. Referring to FIG. 14, the graph shows that the center frequency of the filter can be varied over a range from 11.5 GHz (shown as reference designator 406) to about 12.5 GHz (shown as reference designator 408).

Figure 15:
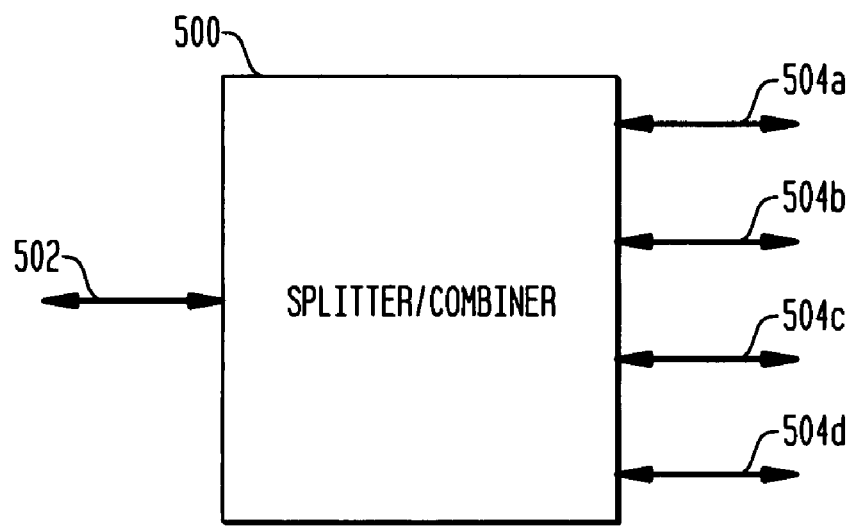
FIG. 15 is a block diagram of a splitter/combiner device in accordance with an embodiment of the application.

FIG. 15 shows a splitter/combiner device 500 in accordance with an embodiment of the present application. The splitter/combiner device can be part of an amplifier or front end filter. The device 500 includes ports 502 and 504a, 504b, 504c and –504d which are configurable as input or output ports based on the configuration of the device. For example, if the device is configured as a combiner, then ports 504a, 504b, 504c and –504d are used as input terminals and port 502 is used as an output terminal. In this case, input signals are fed to ports 504a, 504b, 504c and –504d which are combined to form a single composite output signal at port 502. On the other hand, if the device 500 is configured as a splitter, then a single input signal is fed to port 502 and the device splits the input signal at ports 504a, 504b, 504c and –540d.

Figure 16:
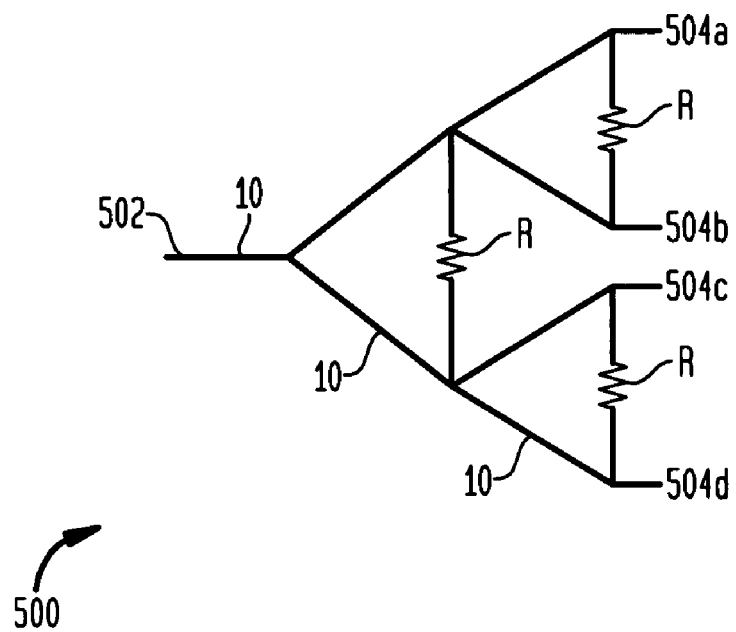
FIG. 16 is a schematic diagram of the splitter/combiner of FIG. 15 in accordance with an embodiment of the application.

FIG. 16 is a schematic diagram of the splitter/combiner device 500 of FIG. 15 in accordance with an embodiment of the present application. The device 500 is based on a Wilkinson splitter/combiner structure well known in the art. A Wilkinson device comprises one or more structures comprising transmission line elements coupled to resistor components R. When configured as a splitter, the device provides equal-amplitude, equal-phase output signals at ports 504a, 504b, 504c and –504d. When configured as a combiner, the device combined equal-phase signals at ports 504a, 504b, 504c and –504d into a single signal in the opposite direction at port 502. The device 500 includes a transmission line structure of the present application, such as structure 10 of FIG. 1, which exhibits relatively low insertion loss such as about 3 dB. In contrast, a conventional splitter/combiner device may exhibit a 3.5 dB to 3.7 dB insertion loss. The additional 0.7 dB loss is undesirable and may be significant if the splitter/combiner device is arranged in a tree configuration having 2 to 4 cascaded combiners with each layer providing additional insertion loss. Thus, the transmission line structure of the present application is well suited for splitter/combiner devices.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims. For example, the height or thickness of the signal conductor 18 and the conductive portions 16, 20 are shown to be the same but can be different.

The invention claimed is:

1. A method comprising:
providing a structure comprising a dielectric material disposed between a first reference conductor and a signal conductor and conductive portions on opposite sides of said signal conductor;
forming a second reference conductor having a recess portion; and
disposing the second reference conductor over the signal conductor with the recess portion facing the signal conductor, wherein the recess portion defines a gap between a bottom surface of the second reference conductor and a top surface of the signal conductor,
wherein the steps of providing the structure and forming a second reference conductor include forming the conductive portions and the signal conductor by a first process and plating a layer of metal onto the conductive portions so that a thickness of the conductive portions exceeds a thickness of the signal conductor, and attaching a bridge structure to said conductive portions so that said bridge structure overlies said signal conductor to define said gap.

2. The method as claimed in claim 1 wherein said bridge structure has a planar major surface attached to said conductive portions, said planar major surface overlying said signal conductor to define said recess portion.

3. The method as claimed in claim 1, wherein the first process includes subtractively processing a metal layer to define said conductive portions and said signal conductor.

4. A transmission line structure comprising:
a dielectric material;
a first reference conductor disposed below the dielectric material;
a signal conductor extending along a top surface of the dielectric material; and
a second reference conductor disposed over the signal conductor, the second reference conductor including a conductive plane and a pair of conductive portions projecting away from the conductive plane so as to define a recess portion between the pair of conductive portions and facing the signal conductor, the recess portion defining a gap between a bottom surface of the second reference conductor and a top surface of the signal conductor,
wherein each of the conductive portions includes a respective etched ridge adjacent the conductive plane and each conductive portion extends along the top surface of the dielectric material alongside the signal conductor, and
wherein the conductive portions are thicker than the signal conductor.

5. The transmission line structure as claimed in claim 4 wherein the respective etched ridges are integral with the conductive plane.

6. A transmission line structure comprising:
a dielectric material;
a first reference conductor disposed below the dielectric material;

a signal conductor extending along a top surface of the dielectric material; and a second reference conductor disposed over the signal conductor, wherein the second reference conductor has a recess portion facing the signal conductor, the recess portion defining a gap between a bottom surface of the second reference conductor and a top surface of the signal conductor, wherein the second reference conductor includes a pair of conductive portions extending alongside the signal conductor along the top surface of the dielectric material and a bridge structure extending between the conductive portions and extending over the signal conductor, and wherein the signal conductor has a first thickness defined by a thickness of a first metal layer, the signal conductor and the conductive portions including etched portions of the first metal layer, and the conductive portions including a second metal layer overlying and plated on the etched portions of the first metal layer, such that the conductive portions have a second thickness greater than the first thickness.

7. A method of transmitting a signal comprising transmitting the signal along a transmission line structure as claimed in claim 6 by applying the signal to the signal conductor.

8. The method of transmitting a signal as claimed in claim 7, wherein the signal generates an electric field that is more concentrated in the gap above the signal conductor than below the signal conductor and through the dielectric material.

9. The transmission line structure as claimed in claim 6 wherein the gap has a relative dielectric constant approximately equal to one (1).

10. The transmission line structure as claimed in claim 6 wherein the structure has an effective dielectric loss approximately equal to zero (0).

11. The transmission line structure as claimed in claim 6 wherein the dielectric material has an effective dielectric constant approximately equal to one (1).

12. The transmission line structure as claimed in claim 6 wherein the structure includes a printed circuit board (PCB).

13. The transmission line structure as claimed in claim 6 wherein the structure is configured to transmit a signal having a propagation velocity approximately equal to the speed of light.

14. The transmission line structure as claimed in claim 6 wherein the first and second reference conductors are configured for connection to the same reference potential and the signal conductor is configured for connection to an input signal for transmission through the signal conductor.

15. The transmission line structure as claimed in claim 6 wherein the second reference conductor is flexible.

16. The transmission line structure as claimed in claim 15 further comprising an actuator coupled to the second reference conductor to allow the actuator to move the second reference conductor in response to a control signal directed to the actuator.

17. The transmission line structure as claimed in claim 16 wherein the structure is configured to transmit a signal having a propagation velocity that is varied in accordance with the movement of the second reference conductor.

18. The transmission line structure as claimed in claim 6 wherein the structure forms a part of at least one of a phase shifter, a microwave filter and a splitter/combiner device.

19. The transmission line structure as claimed in claim 6 wherein the dielectric material has a relative dielectric constant greater than one (1).

20. The transmission line structure as claimed in claim 6 wherein said bridge structure has a major surface joined to said conductive portions to define said recess portion, said major surface overlying said signal conductor to define said gap.

21. The transmission line structure as claimed in claim 20 wherein the bridge structure is a plate and said major surface defines a plane.

22. A method comprising:

providing a structure comprising a dielectric material disposed between a first reference conductor and a signal conductor;

forming a second reference conductor having a recess portion; and disposing the second reference conductor over the signal conductor with the recess portion facing the signal conductor, wherein the recess portion defines a gap between a bottom surface of the second reference conductor and a top surface of the signal conductor, wherein the step of forming the second reference conductor includes removing a portion from a starting structure to define the recess portion.

23. The method as claimed in claim 22 wherein the signal conductor extends along a top surface of the dielectric material, and wherein the second reference conductor includes a pair of conductive portions extending alongside the signal conductor along the top surface of the dielectric and a bridge structure extending between the conductive portions and extending over the signal conductor, the bridge structure including the recess portion and a pair of ridges on opposite sides of the recess portion.

24. The method as claimed in claim 23 wherein the conductive portions and the signal conductor are formed to have the same thickness.

25. The method as claimed in claim 24 wherein the bridge structure includes a conductive plane between the pair of ridges.

26. The method as claimed in claim 25 wherein the pair of ridges are formed by etching the starting structure.

27. The method as claimed in claim 22 wherein the second reference conductor is flexible.

* * * * *